United States Patent [19]

Schachameyer et al.

[11] Patent Number: 4,668,304
[45] Date of Patent: May 26, 1987

[54] DOPANT GETTERING SEMICONDUCTOR PROCESSING BY EXCIMER LASER

[75] Inventors: Steven R. Schachameyer, Whitefish Bay; James A. Benjamin, Waukesha; John B. Pardee, Milwaukee, all of Wis.; Lyle O. Hoppie, Birmingham, Mich.; Herman P. Schutten, Milwaukee, Wis.

[73] Assignee: Eaton Corporation, Cleveland, Ohio

[21] Appl. No.: 721,552

[22] Filed: Apr. 10, 1985

[51] Int. Cl.[4] .......................................... H01L 21/265
[52] U.S. Cl. .................................. 148/1.5; 29/576 B; 29/576 T; 148/175; 148/187; 148/DIG. 60; 148/DIG. 93; 427/53.1
[58] Field of Search ................... 148/1.5, 187, 175; 29/576 B, 576 T; 427/53.1

[56] References Cited

U.S. PATENT DOCUMENTS

| | | | |
|---|---|---|---|
| 4,183,780 | 1/1980 | McKenna et al. | 156/643 |
| 4,260,649 | 4/1981 | Denison et al. | 427/53.1 |
| 4,292,093 | 9/1981 | Ownby et al. | 148/1.5 |
| 4,529,617 | 7/1985 | Chenevas-Paule et al. | 427/53.1 |
| 4,540,466 | 9/1985 | Nishizawa | 156/643 |

OTHER PUBLICATIONS

Andreatta et al. Appl. Phys. Lelts. 40 (1982) 183.

*Primary Examiner*—Upendra Roy
*Attorney, Agent, or Firm*—Andrus, Sceales, Starke & Sawall

[57] ABSTRACT

A dopant gettering semiconductor processing technique is disclosed for selectively activating an otherwise benign reactant to remove dopant from a semiconductor wafer substrate. Excimer pulsed ultraviolet laser radiation is provided at a discrete designated pulsed wavelength corresponding to a discrete designated gettering excitation energy of the otherwise benign reactant photochemically breaking bonds of the reactant such that the reactant is photolytically activated to remove dopant from the substrate, without thermally driven pyrolytic reaction. The bonds of a reactant gas are photochemically broken to produce gettering agents reacting with the substrate to remove dopant by forming a gaseous compound liberated from the substrate and benign to and unactivated by the discrete designated wavelength of the excimer pulsed ultraviolet laser radiation.

7 Claims, 4 Drawing Figures

WAVELENGTH (nm)
EXCITATION ENERGY (eV)

4,668,304

DOPANT GETTERING SEMICONDUCTOR PROCESSING BY EXCIMER LASER

BACKGROUND AND SUMMARY

The invention provides a dopant gettering semiconductor processing technique for selectively photochemically activating an otherwise benign reactant to remove dopant from a substrate.

In various semiconductor processing operations, it is difficult to control various processing parameters, particularly thermally driven deposition, diffusion and the like. The resultant dopant concentration in the semiconductor substrate lattice in turn may vary, which is undesirable in high precision applications. In order to ensure sufficient dopant concentration and the desired electrical charactertistics, the semiconductor layer is typically overdoped, and then a gettering agent is used to remove some of the dopant to achieve the desired concentration.

The present invention provides a particulary simple and efficient dopant gettering technique which can be used to obtain a more uniform dopant concentration.

DETAILED DESCRIPTION

Figure 1:
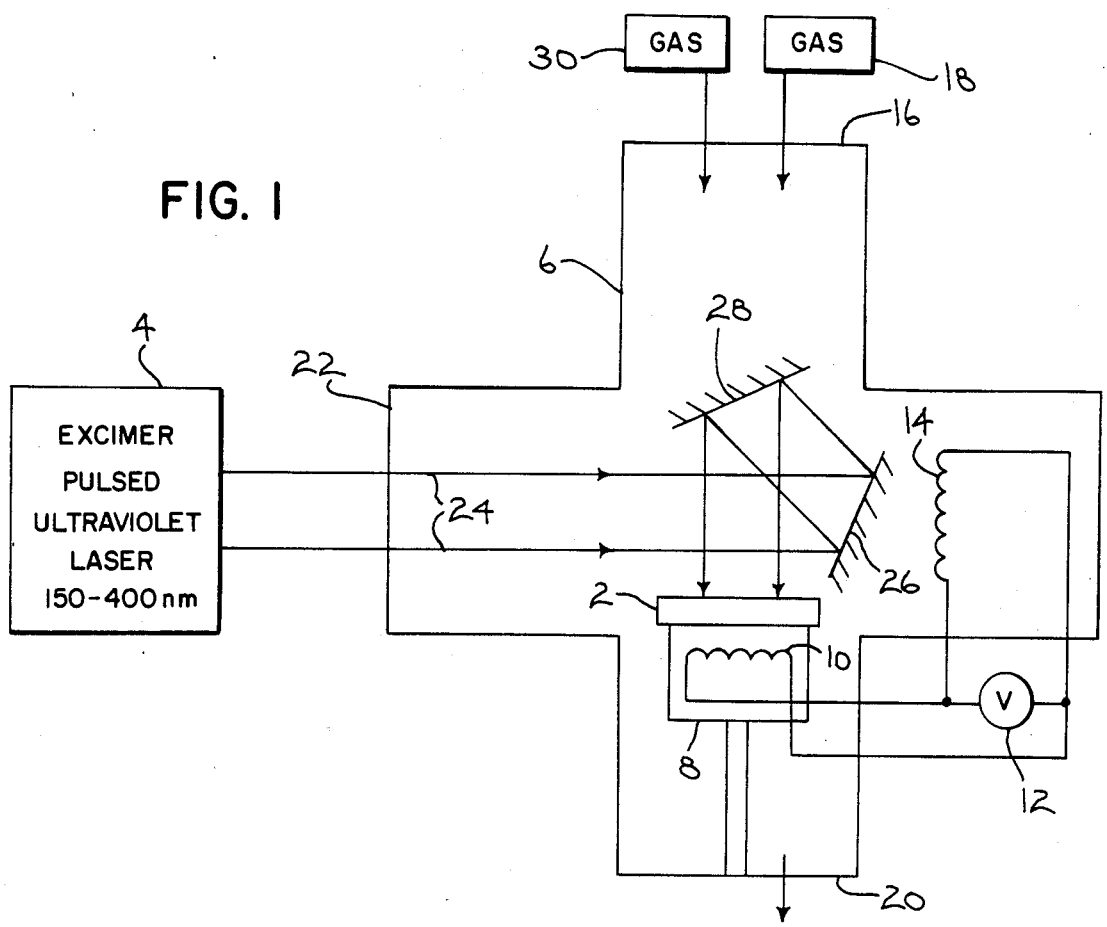
FIG. 1 schematically illustrates the semiconductor processing technique in accordance with the invention.

FIG. 1 illustrates a dopant gettering semiconductor processing technique for selectively activating an otherwise benign reactant to remove dopant from a semiconductor wafer substrate 2. Excimer pulsed ultraviolet laser radiation is provided from laser 4 at a discrete designated pulsed wavelength corresponding to a discrete designated excitation energy of an otherwise benign reactant gas such that the reactant is photolytically activated to remove dopant from substrate 2 without thermally driven pyrolytic reaction.

A conventional processing chamber 6 may be used, and semiconductor wafer substrate 2 is placed on a supporting pedestal 8 in the chamber which may have a resistance heater coil 10 or the like driven by a voltage source 12 for heating substrate 2 and/or a resistance heater coil 14 in chamber 6 for heating the interior thereof. These thermal processing elements are optional in the method of the present invention. Reactant gas is introduced into chamber 6 at port 16 from gas supply 18, and may be exhausted at port 20, all as is conventional. Chamber 6 typically has an observation window or port 22.

Figure 3:
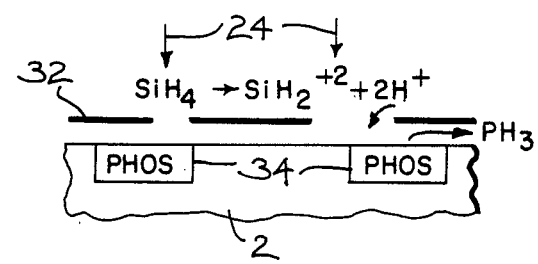
FIG. 3 shows a gas absorption spectrum.
Figure 2:
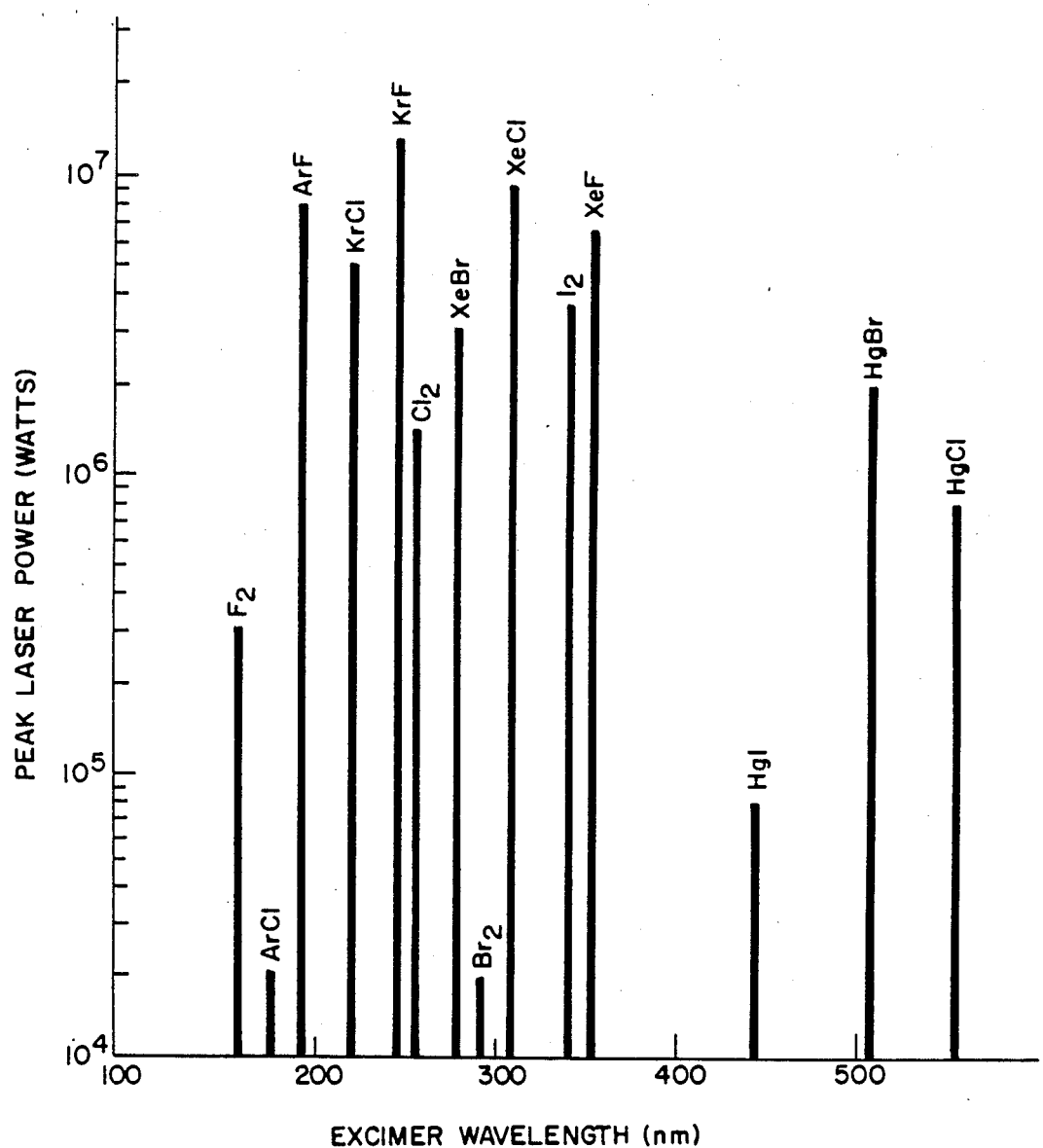
FIG. 2 shows various available excimer pulsed ultraviolet laser radiation wavelengths and peak power.

Excimer pulsed ultraviolet laser radiation from laser 4 is introduced into chamber 6 at 24 through port 22, and may be directed by mirrors 26 and 28 to impinge wafer substrate 2 substantially perpendicularly thereto. FIG. 2 shows various available excimer pulsed ultraviolet laser radiation wavelengths and peak power, and FIG. 3 shows an absorption spectrum of a reactant gas with absorption peaks at discrete designated excitation energy wavelengths. The excimer radiation wavelength is chosen according to the reactant gas absorption peaks, or vice versa. The narrow spectral output of the excimer laser enables highly specific electronic excitation of reactants, allowing selective breaking of a particular molecule's bonds, driving a predetermined controllable reaction. The excimer laser may be tuned to differentially break bonds of a desired type of gas molecule from a mixture of gases. The gas molecule bonds are broken photochemically with a photolytic reaction at a temperature ranging from room temperature to about 400° C., rather than a thermally driven pyrolytic reaction wherein the gas molecule bonds are thermally agitated and vibrationally broken at substantially higher temperatures typically around 1,000° C.

In a particularly desirable aspect of the invention, a plurality of otherwise benign reactants are provided, either in a gaseous mixture of plural gases from source 18, or a plurality of gas sources such as 30 and 18. The excimer pulsed ultraviolet laser radiation is provided at a plurality of different discrete designated pulsed wavelengths corresponding respectively to discrete excitation energies of the reactants from sources 30 and 18 for selectively choosing the dopant to be removed from substrate 2 according to the designated wavelength.

Figure 4:
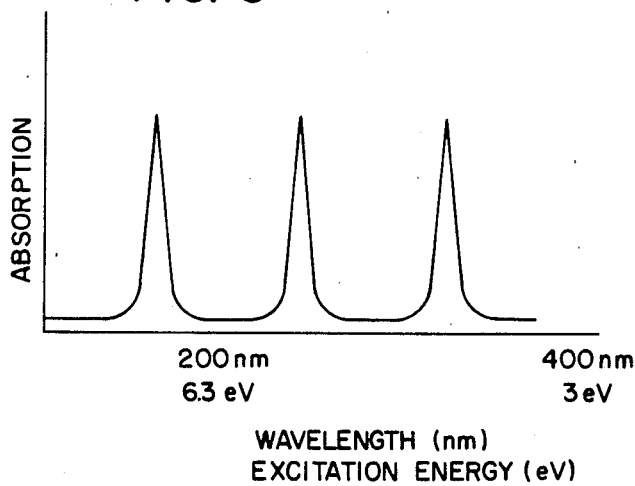
FIG. 4 illustrates a particular species of the invention.

As shown in FIG. 4, a mask 32 may be provided over substrate 2, and the substrate is irradiated with the excimer laser radiation at 24 through mask 32 to activate the otherwise benign reactant only at selected areas such as 34 exposed by the mask to decrease dopant concentration only at such selected areas.

In one desirable species, substrate 2 has portions of phosphorous at 34, and the reactant is provided by silane gas $SiH_4$. The excimer pulsed ultraviolet laser radiation is provided by an argon fluoride excimer laser at 193 nanometers or a krypton fluoride excimer laser at 248 nanometers corresponding to a discrete excitation energy of the silane gas photochemically breaking bonds of the gas photolytically activating and releasing hydrogen atoms which react with the phosphorous at 34 to produce a compound gas of phosphorous and hydrogen $PH_3$ removing phosphorous from the substrate to decrease phosphorous concentration. The laser output is provided at up to 1 joule per pulse at up to 250 hertz.

The excimer pulsed ultraviolet laser radiation at the discrete designated wavelength photolytically reacts with the otherwise benign reactant gas in the chamber at a discrete gettering excitation energy photochemically breaking bonds of the gas to produce gettering agents such as the two hydrogen atoms as shown in FIG. 4 reacting with the substrate to remove dopant therefrom, all without thermally driven pyrolytic reaction. The gettering agent reacts with dopant in the substrate to form a gaseous compound, for example $PH_3$ in FIG. 4, liberated from the substrate and benign to and unactivated by the discrete designated wavelength of the excimer pulsed ultraviolet laser radiation.

It is recognized that various alternatives and modifications are possible within the scope of the appended claims.

We claim:

1. A dopant gettering semiconductor procesing technique for selectively activating an otherwise benign reactant to remove dopant from a substrate, comprising providing excimer pulsed ultraviolet laser radiation at a discrete designated pulsed wavelength corresponding to a discrete designated excitation energy of said otherwise benign reactant photochemically breaking bonds of said reactant such that said reactant is photolytically activated to remove dopant from said substrate without thermally driven pyrolytic reaction.

2. The invention according to claim 1 comprising providing a plurality of said otherwise benign reactants and providing said excimer pulsed ultraviolet laser radiation at a plurality of different discrete designated pulsed wavelengths corresponding respectively to discrete designated excitation energies of said reactants for selectively choosing the dopant to be removed from said substrate according to said wavelength.

3. The invention according to claim 1 comprising providing a mask and irradiating said substrate with said excimer pulsed ultraviolet laser radiation through said mask to activate said otherwise benign reactant only at selected areas exposed by said mask to decrease dopant concentration only at said selected areas.

4. The invention according to claim 1 comprising providing said substrate with at least portions of phosphorous, providing a silane gas said reactant, and providing said excimer pulsed ultraviolet laser radiation at a discrete designated pulsed wavelength corresponding to a discrete excitation energy of said silane gas photochemically breaking bonds of said gas photolytically activating and releasing hydrogen atoms which react with said phosphorous in said substrate to produce a compound gas of phosphorous and hydrogen removing phosphorous from said substrate to decrease phosphorous concentration.

5. A dopant gettering semiconductor processing technique for selectively activating an otherwise benign reactant to remove dopant from a substrate, comprising:
   providing a processing chamber;
   placing a semiconductor wafer substrate in said chamber;
   introducing an otherwise benign reactant gas into said chamber;
   providing an excimer pulsed ultraviolet laser and introducing radiation therefrom into said chamber at a discrete designated wavelength to photolytically react with said gas at a discrete designated gettering excitation energy photochemically breaking bonds of said gas to produce gettering agents reacting with said substrate to remove dopant therefrom, without thermally driven pyrolytic reaction.

6. The invention according to claim 5 wherein said gettering agent reacts with said dopant in said substrate to form a gaseous compound liberated from said substrate and benign to and unactivated by said discrete designated wavelength of said excimer pulsed ultraviolet laser radiation.

7. The invention according to claim 6 comprising providing a mask and irradiating said substrate with said excimer pulsed ultraviolet laser radiation through said mask to decrease dopant concentration in said substrate in areas exposed by said mask.

* * * * *